United States Patent
Gawlick et al.

[11] 3,967,141
[45] June 29, 1976

[54] PIEZOELECTRIC ENERGY SOURCE

[75] Inventors: Heinz Gawlick, Furth; Uwe Brede, Schwaig; Hellmut Bendler, Erlangen-Spardorf, all of Germany

[73] Assignee: Dynamit Nobel Aktiengesellschaft, Germany

[22] Filed: Nov. 3, 1971

[21] Appl. No.: 195,431

[30] Foreign Application Priority Data
Dec. 1, 1970   Germany............................ 2058968

[52] U.S. Cl............................. 310/8.7; 102/70.2 A; 310/8.4; 310/9.1
[51] Int. Cl.²....................................... H01L 41/08
[58] Field of Search ................. 310/8, 8.1, 8.3, 8.4, 310/8.7, 9.1, 9.2, 9.3, 9.4; 102/70.2 R, 70.26 A, 70.26

[56] References Cited
UNITED STATES PATENTS

| | | | |
|---|---|---|---|
| 2,827,851 | 3/1958 | Ferrara | 102/70.2 GA |
| 2,970,545 | 2/1961 | Howe | 102/70.2 G |
| 3,211,069 | 10/1965 | Rixton | 310/8.7 UX |
| 3,320,890 | 5/1967 | Ciccone et al. | 310/8.7 X |
| 3,356,026 | 12/1967 | Lubig | 310/8.4 X |
| 3,396,311 | 8/1968 | Maltner et al. | 310/8.7 X |
| 3,457,461 | 7/1969 | Steinke et al. | 310/8.7 X |
| 3,486,075 | 12/1969 | Steinke et al. | 310/8.7 X |

OTHER PUBLICATIONS

*Direct Energy Conversion* by Angrist, pp. 390–395, 1965.

*Primary Examiner*—Mark O. Budd
*Attorney, Agent, or Firm*—Craig & Antonelli

[57] ABSTRACT

A piezoelectric energy source having a piezoelectric transducer mounted in a housing and a movable piston arranged in the housing to bias the transducer to provide a desired electrical output. The piston exerts pressure on the transducer in response to a pyrotechnic charge and is locked in a predetermined biasing position by a locking arrangement such that a constantly effective pressure is exerted on the transducer.

16 Claims, 1 Drawing Figure

U.S. Patent  June 29, 1976  3,967,141
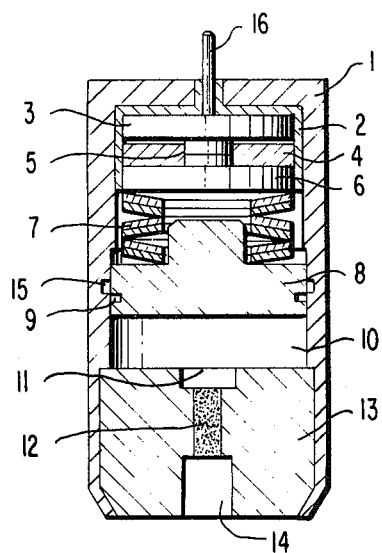

PIEZOELECTRIC ENERGY SOURCE

The present invention relates to a piezoelectric energy source for use as an electrical detonator responsive to pressure which gradually increases to a final pressure which is maintained.

Piezoelectric energy sources are known wherein the piezoelectric effect is produced by mechanical impact or shock. In some applications, detonators based on this type of construction exhibit the disadvantageous characteristic that the thus generated pressure occurs suddenly and immediately drops. Therefore, a storage of the electrical charge produced in this manner is only possible through use of an electrical circuit.

In accordance with the present invention, the disadvantages of the prior art arrangements are overcome by the provision of a piezoelectric energy source wherein pressure is exerted via a piston on a piezoelectric transducer and the piston is locked in position after a predetermined pressure is reached thereby maintaining the predetermined pressure on the piezoelectric transducer.

An advantageous embodiment of an energy source in accordance with the present invention resides in that the pressure is exerted by means of a conventional pyrotechnic pressure charge. However, it is also possible to produce the pressure, for example, with the aid of conventional mechanical devices and exert this pressure on the piston.

According to the present invention, a piezoelectric transducer in the form of a piezo pellet is mounted in a conventional manner between a pressure plate on which the piston acts and an electrode. It is, of course, necessary or storing the thus produced electrical charge that the electrode be sufficiently insulated with respect to the pressure plate and the metallic housing. In this manner, the system of the electrode, insulation, and plate or housing constitutes a capacitor having a capacitance which is dependent on the type and thickness of the insulating material which permits the compressing of the piezo pellet. Thus, even when the pellet is to be destroyed, there is provided a storage arrangement for the charge produced due to the capacitance of the entire electrode system. As indicated, the charge produced is a result of the pressure exerted by the piston, which pressure is maintained.

In accordance with one feature of the present invention, the pressure is maintained by locking the piston in place. The locking of the piston is advantageously attained with the aid of one or more spring rings arranged about the piston circumferential surface and corresponding grooves in the inner wall of the piston housing located between the piezo pellet and the initial position of the spring rings on the piston. One the piston moves in the direction toward the piezo pellet due to the pressure exerted thereon, the spring ring engages in a groove after the piston has traversed a predetermined path. Thus, the piston is locked in a forward position and exerts the thus obtained pressure constantly on the piezo pellet. The length of the distance between the groove in the piston housing and the spring ring at the piston in the initial position of the piston is proportional to the final pressure which is constantly effective on the piezo transducer. Since the charge produced by the piezo pellet is proportional to the pressure exerted thereon, it is possible to vary the aforementioned distance between the spring ring at the piston and the groove in the piston housing to generate a desired, predetermined charge, and also to store this charge.

According to another feature of the present invention, the piston is mounted within the system by means of springs, preferably cup springs, in such a manner that the piston cannot in the initial rest position exert a pressure on the piezo pellet by impact or shock, for example, during the transporting of the device. These springs must, of course, be designed so that they can yield to the pressure effective on the piston, which pressure in turn serves for the activation of the piezo pellet. The springs preferably should be capable of storing a force larger than 500 kp.

In accordance with a further feature of the present invention, when a pyrotechnic propellent charge is utilized as the pressure source, a convention delay charge is provided in front of the propellent charge which is advantageous for some applications. This makes it possible to begin the pressure buildup after a predetermined period of delay with the initiator functioning only after a predetermined period of time subsequent to ignition. The ignition of the propellent charge, or the delay charge disposed in front thereof can be effected by an electrical as well as mechanical primer. In addition, it is also possible for the charge to be ignited by a flame.

It is therefore an object of the present invention to provide a piezoelectric energy source which overcomes the disadvantages of prior art arrangements.

It is another object of the present invention to provide a piezoelectric energy source having a piston exerting a constantly effective pressure on a piezoelectric transducer.

It is still another object of the present invention to provide a piezoelectric energy source having a locking arrangement for the piston which exerts pressure on the piezoelectric transducer.

These and other objects, features and advantages of the present invention will become more obvious from the following description when taken in connection with the accompanying drawing in which the FIGURE shows, for purposes of illustration only, a cross-sectional view of one embodiment of a piezoelectric energy source in accordance with the present invention.

Referring now to the drawing, the FIGURE shows a piezoelectric ignition generator detonator including a housing 1 formed of a metal of a specific strength and having an insulating cap 2 and an electrode 3 arranged at the top portion thereof. Below the electrode 3, there is arranged an insulating ring 4 of a larger thickness than the insulating cap and containing a bore in the center in which a piezoelectric transducer in the form of a piezo pellet 5 is disposed. A movable metal plate 6 is arranged below the ring 4 and is insulated from the housing by the insulating cap 2. In order to maintain the system in position and to increase the safety during transportation, a cup spring 7 is provided which is attached to the upward extension of a piston 8. The piston 8 which is pressed in in the housing by a force fit, is provided with a spring ring groove about the circumferential surface and a spring ring 9 is disposed therein for the subsequent locking process. Beneath the piston there is provided a pressure chamber 10 having a volume which is dependent on the design of the entire system and is adapted for a primer system 11. A pyrotechnic delay charge 12 may be arranged below the primer system 11 with the primer system and the delay charge being disposed in a mounting 13 which is flanged into the housing 1 to form a terminal part of the entire system. The ignition of the charge takes place by firing or percussion and a corresponding priming charge 14 forms the end of the piezoelectric ignition generator.

In operation, the priming charge 14 is initiated by percussion or electrical energy thereby igniting the delay charge 12. After the delay period of the charge 12, the primer and pressure composition 11 is initiated. The pressure charge 11 displaces the piston 8 in the axial direction with the cup spring 7 being biased against the pressure plate 6 which compresses the piezo pellet 5. The stops provided in the housing shell 1 limit the total travel path of the piston 8. However, before the piston abuts against the stops, the piston is locked in a predetermined forward position by the spring ring 9 engaging the groove 15 with a snap-locking connection. Thus, a constant compression force on the pellet is maintained. Due to the predetermined design of the piezo pellet 5, as well as the capacitance of the system formed by the insulation 2,4, as well as electrode 3, the plate 6 and housing 1, a corresponding resultant voltage is provided at an electric terminal 16 in contact with the electrode 3 and the housing 1.

Obviously, many modifications and variations of the present invention are possible in the light of the above teachings. It should thereore be understood that within the scope of the appended claims, the invention may be practiced otherwise than as specifically described.

We claim:

1. A piezoelectric energy source comprising a housing, a piezoelectric transducer arranged within said housing, piston means mounted for movement within said housing for exerting pressue on said piezoelectric transducer in accordance with the extent of the path of movement thereof from an initial rest position, and means for nondisengagingly locking said piston means in a predetermined position along the path of movement of said piston means corresponding to a predetermined pressure on said piezoelectric transducer, said piezoelectric transducer providing an output in accordance with the pressure exerted thereon, and said housing forms a portion of a capacitor for storing the output of said piezoelectric transducer.

2. A piezoelectric energy source comprising a housing, a piezoelectric transducer arranged within said housing, piston means mounted for movement within said housing for exerting pressure on said piezoelectric transducer in accordance with the extent of the path of movement thereof from an initial rest position, means for locking said piston means in a predetermined position along the path of movement corresponding to a predetermined pressure, and a pyrotechnic propellant charge provided within said housing serving as a pressure source for causing movement of said piston means toward said piezoelectric transducer.

3. A piezoelectric energy source comprising a housing, a piezoelectric transducer arranged within said housing, piston means mounted for movement within said housing for exerting pressure on said piezoelectric transducer in accordance with the extent of the path of movement thereof from an initial rest position, and means for locking said piston means in a predetermined position along the path of movement corresponding to a predetermined pressure, said locking means including a groove arranged in the circumferential surface of said piston means and a spring ring arranged in said groove.

4. A piezoelectric energy source as defined in claim 3 wherein said housing is provided with a groove about the inner surface thereof adapted to receive said spring ring when said piston means travels along the path of movement thereof toward said piezoelectric transducer.

5. A piezoelectric energy source as defined in claim 4 wherein said groove in said housing in positioned between said piezoelectric transducer and said groove in said piston means when said piston means is in the initial rest position.

6. A piezoelectric energy source as defined in claim 2 including a pressure chamber in said housing arranged between said piston means and said pyrotechnic propellent charge.

7. A piezoelectric energy source comprising a housing, a piezoelectric transducer arranged within said housing, piston means mounted for movement within said housing for exerting pressure on said piezoelectric transducer in accordance with the extent of the path of movement thereof from an initial rest position, and means for locking said piston means in a predetermined position along the path of movement corresponding to a predetermined pressure, said piston means including a cup spring and a piston, said cup spring positioning said piston within said housing.

8. A piezoelectric energy source as defined in claim 2 wheren said pyrotechnic propellent charge is responsive to mechanical igniting means.

9. A piezoelectric energy source as defined in Claim 2 wherein said pyrotecnic propellent charge is responsive to electrical igniting means.

10. A piezoelectric energy source as defined in Claim 2 wherein said locking means includes a groove arranged in the circumferential surface of said piston means and a spring ring arranged in said groove, said housing being provided with a groove about the inner surface thereof and adapted to receive said spring ring when said piston moves along the path of movement thereof.

11. A piezoelectric energy source as defined in claim 10, including a pressure chamber in said housing arranged between said piston means and said pyrotechnic propellent charge.

12. A piezoelectric energy source as defined in claim 11 wherein said piston means includes a cup spring and a piston, said cup spring positioning said piston within said housing and arranged between said piston and said piezoelectric transducer.

13. A piezoelectric energy source as defined in claim 12 including two metal plates arranged within said housing and having said piezoelectric transducer arranged therebetween, said cup spring being in contact with one of said plates and said piston.

14. A piezoelectric energy source as defined in claim 13 wherein the other of said plates is provided with an electrical terminal, the housing serving as the other electrical terminal for said piezoelectric energy source.

15. A piezoelectric energy source comprising a housing, a piezoelectric transducer arranged within said housing, piston means mounted for movement within said housing for exerting pressure on said piezoelectric transducer in accordance with the extent of the path of movement thereof from an initial rest position, and means for nondisengagingly locking said piston means in a predetermined position along the path of movement of said piston means corresponding to a predetermined pressure on said piezoelectric transducer, said piston means including a piston member mounted within said housing for movement therein and said locking means directly engages said piston member for nondisengagingly locking said piston member in a predetermined position along the path of movement thereof.

16. A piezoelectric energy source as defined in claim 15, wherein said locking means is disposed only within said housing.

* * * * *